United States Patent
Shin

(10) Patent No.: US 6,483,771 B2
(45) Date of Patent: Nov. 19, 2002

(54) SEMICONDUCTOR MEMORY DEVICE AND METHOD OF OPERATION HAVING DELAY PULSE GENERATION

(75) Inventor: Tae-jeen Shin, Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/875,001

(22) Filed: Jun. 7, 2001

(65) Prior Publication Data

US 2002/0001252 A1 Jan. 3, 2002

(30) Foreign Application Priority Data

Jun. 30, 2000 (KR) .......................... 2000-37398

(51) Int. Cl.[7] ................................. G11C 8/00
(52) U.S. Cl. ................... 365/233; 365/194; 365/230.03
(58) Field of Search ................ 365/233, 201, 365/194, 225, 191, 230.03

(56) References Cited

U.S. PATENT DOCUMENTS

| | | | |
|---|---|---|---|
| 5,083,299 A | | 1/1992 | Schwanke et al. .......... 368/113 |
| 5,955,905 A | * | 9/1999 | Idei et al. .................. 327/160 |
| 5,973,525 A | * | 10/1999 | Fujii .......................... 327/158 |
| 5,999,483 A | * | 12/1999 | Itou ........................... 365/233 |
| 6,005,825 A | * | 12/1999 | Lee et al. ................... 365/233 |
| 6,014,339 A | * | 1/2000 | Kobayashi et al. ......... 365/233 |
| 6,239,631 B1 | * | 5/2001 | Fujioka et al. ............. 327/144 |

* cited by examiner

*Primary Examiner*—David Nelms
*Assistant Examiner*—Thong Le
(74) *Attorney, Agent, or Firm*—Valentine Francos, P.L.L.C.

(57) ABSTRACT

A semiconductor memory device including a memory core block, a logic circuit and a direct access circuit which control the memory core block, and a delay pulse generation circuit. The logic circuit generates first and second internal clock signals responsive to first and second external clock signals, and operates the memory core block at high speed during a normal operation. The direct access circuit generates first and second internal clock signals responsive to first and second external clock signals, to test the memory core block during a direct access operation. The delay pulse generation circuit generates a pulse signal corresponding to the delay difference between the first and second internal clock signals generated by the direct access circuit. The delay difference is used by a tester to compensate for actual delay of the internal clock signals when the memory core block is tested during the direct access operation.

18 Claims, 3 Drawing Sheets

SEMICONDUCTOR MEMORY DEVICE AND METHOD OF OPERATION HAVING DELAY PULSE GENERATION

The present application claims priority under 35 U.S.C. §119 to Korean Application No. 00-37398 filed on Jun. 30, 2000, which is hereby incorporated by reference in its entirety for all purposes.

BACKGROUND OF THE INVENTION

1. Field of the Invention

The present invention relates to a semiconductor memory device and method of operation thereof, and more particularly, to delay pulse generation for measuring the delay between internal control signals.

2. Description of the Related Art

As computer systems deliver higher and higher performance, it is necessary for semiconductor memory devices to have a large capacity and operate at high speed. Semiconductor memory devices can have a large capacity by including memory blocks each having a plurality of memory cells, and can operate at a high speed through a logic circuit operating at a high frequency.

FIG. 1 is a schematic diagram illustrating a conventional semiconductor memory device. Referring to FIG. 1, a semiconductor memory device 100 includes a high frequency logic circuit 110, a low frequency direct access unit (DA) 120 and a memory core block 130. The high frequency logic circuit 110 is generally controlled by external clock signals $\phi1$ and $\phi2$, and generates internal clock signals $\phi1'$ and $\phi2'$ to control the operation of the memory core block 130. Therefore, the memory core block 130 operates at high speed according to the operation specifications of an actual semiconductor memory device. The low frequency DA 120 is used for testing for defects of memory cells within the memory core block 130. The low frequency DA 120 receives the external clock signals $\phi1$ and $\phi2$ without operation of the high frequency logic circuit 110, and generates internal clock signals $\phi1'$ and $\phi2'$ to control the operation of the memory core block 130. Since it is not necessary to operate the memory core block 130 at high speed during testing for defects of memory cells, the low frequency DA 120 operates at low speed.

The internal clock signals $\phi1'$ and $\phi2'$ generated by the high frequency logic circuit 110 have different delay times than the internal clock signals $\phi1'$ and $\phi2'$ generated by the low frequency DA 120. This will be described with reference to the timing chart shown in FIGS. 2A and 2B. FIG. 2A illustrates the internal clock signals $\phi1'$ and $\phi2'$ generated by the high frequency logic circuit 110 in response to the external clock signals $\phi1$ and $\phi2$. Since the high frequency logic circuit 110 operates in synchronous relation to a clock signal, the delay time $\Delta\phi1'$ between the first external clock signal $\phi1$ and the first internal clock signal $\phi1'$ is almost the same as the delay time $\Delta\phi2'$ between the second external clock signal $\phi2$ and the second internal clock signal $\phi2'$.

FIG. 2B shows the internal clock signals $\phi1'$ and $\phi2'$ generated by the low frequency DA 120. Unlike the high frequency logic circuit 110, the low frequency DA 120 asynchronously operates, and a load on a path through which the first internal clock signal $\phi1'$ is generated is different from a load on a path through which the second internal clock signal $\phi2'$ is generated in the low frequency DA 120. Accordingly, the delay time $\Delta\phi1'$ between the first external clock signal $\phi1$ and the first internal clock signal $\phi1'$ is different from the delay time $\Delta\phi2'$ between the second external clock signal $\phi2$ and the second internal clock signal $\phi2'$.

The internal clock signals $\phi1'$ and $\phi2'$ are important to the operation of the memory core block 130. When the internal clock signals $\phi1'$ and $\phi2'$ are generated at different times, that is, when $\Delta\phi1'$ is different from $\Delta\phi2'$, there may be an error in the operation of memory core block 130. In other words, the memory core block 130 operates normally depending on the internal clock signals $\phi1'$ and $\phi2'$ simultaneously generated (i.e. $\Delta\phi1'=\Delta\phi2'$) while the semiconductor memory device 100 is operating at high speed in relation with the high frequency logic circuit 110. However, the memory core block 130 does not operate properly due to the internal clock signals $\phi1'$ and $\phi2'$ sequentially generated with a delay time therebetween (i.e. $\Delta\phi1'\neq\Delta\phi2'$) while the semiconductor memory device 100 is operating at low speed in relation with the low frequency DA 120. Even if the memory core block 130 does not operate in error while it is being operated by the low frequency DA 120, the memory core block 130 does not satisfy the conditions of normal operation. Consequently, complete operating conditions required for testing memory cells within the memory core block 130 using a direct access method cannot be achieved.

Therefore, a memory device which can operate a memory core block under the same conditions both when the memory core block operates depending on a high frequency logic circuit and when the memory core block operates depending on a low frequency DA, is desired.

SUMMARY OF THE INVENTION

The present invention is therefore directed to a semiconductor memory device and method of operation which substantially overcomes one or more of the problems due to the limitations and disadvantages of the related art.

To solve the above problems, it is an object of the present invention to provide a semiconductor memory device capable of operating a memory core block under the same conditions during high speed operation and during a direct access operation without a delay between internal clock signals.

Accordingly, to achieve the above objects of the invention, there is provided a semiconductor memory device including a memory core block including a plurality of memory cells; a logic circuit that generates a first internal clock signal and a second internal clock signal in response to a first external clock signal and a second external clock signal, respectively, and that operates the memory core block at high speed, during normal operation; a direct access circuit that generates the first internal clock signal and the second internal clock signal in response to the first external clock signal and the second external clock signal, respectively, to test the memory cells within the memory core block during a direct access operation; and a delay pulse generation circuit that generates a pulse signal corresponding to the delay difference between the first internal clock signal and the second internal clock signal generated by the direct access circuit.

The delay pulse generation circuit may include a first internal pulse generator that receives the first internal clock signal and that generates a first internal pulse signal having a predetermined pulse width; a second internal pulse generator that receives the second internal clock signal and that generates a second internal pulse signal having a predetermined pulse width; and a pulse signal generator that receives the first and second internal pulse signals and that generates the pulse signal. The pulse signal is transmitted to a pad in response to a third internal clock signal.

According to the semiconductor memory device of the present invention, the time period of the pulse signal generated by the delay pulse generation circuit receiving the internal clock signals having different delay times is measured. A tester compensates for the measured time period before the direct access test. Therefore, the memory core block is allowed to operate depending on internal clock signals having the same conditions as those of internal clock signals generated by the logic circuit, even during the direct access operation, so that errors in the operation of the memory core block can be prevented.

The above objects of the invention may also be achieved by a method of operating a semiconductor memory device having a memory core block that includes a plurality of memory cells, the method including generating a first internal clock signal and a second internal clock signal respectively responsive to a first external clock signal and a second external clock signal; operating the memory core block based on the first and second internal clock signals during a normal operation mode; generating a third internal clock signal and a fourth internal clock signal respectively responsive to the first external clock signal and the second external clock signal; testing the plurality of memory cells based on the third and fourth internal clock signals during a direct access operation mode; and generating a pulse signal corresponding to a delay difference between the third and fourth internal clock signals.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PRESENT INVENTION

Figure 1:
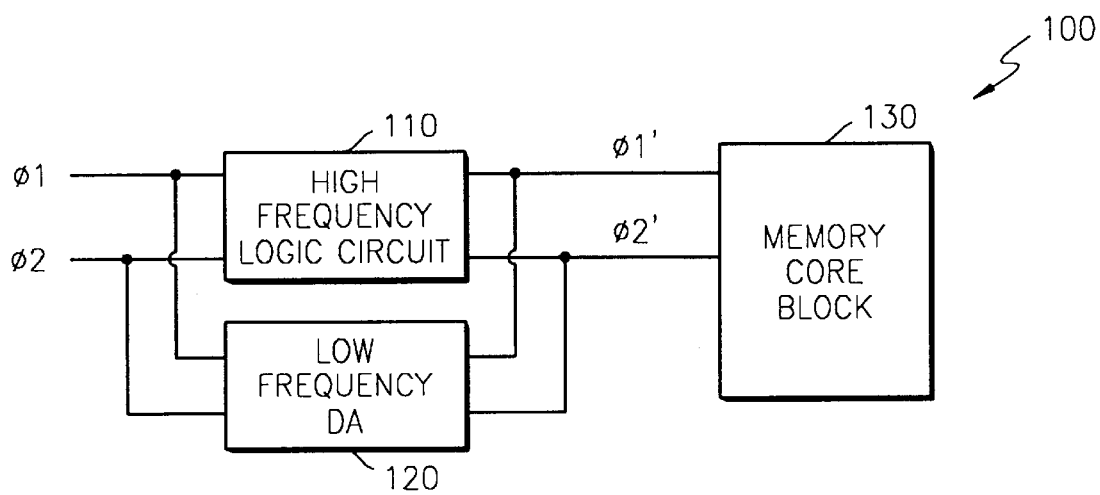
FIG. 1 is a schematic diagram illustrating a conventional semiconductor memory device.
Figure 2A:
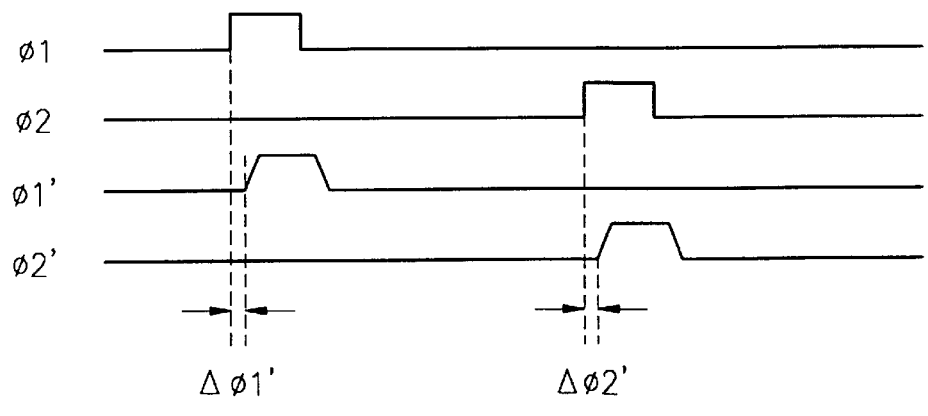
FIGS. 2A and 2B are timing diagrams illustrating internal control signals in the semiconductor memory device of FIG. 1.
Figure 2B:
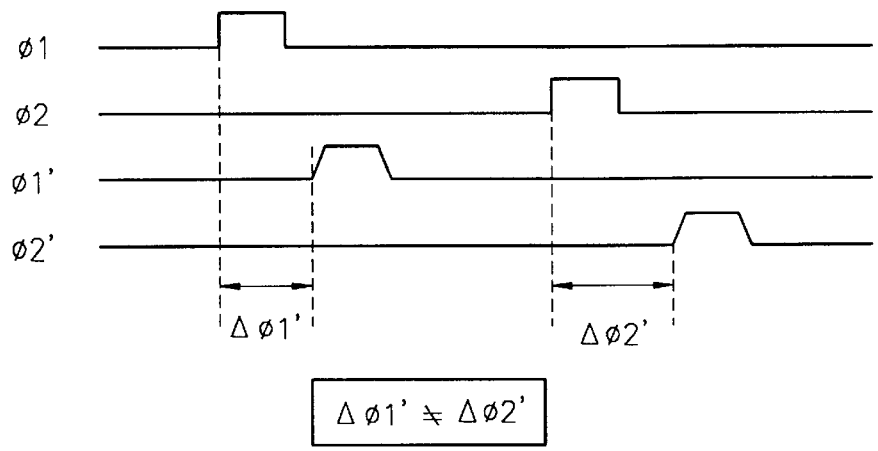

Hereinafter, an embodiment of the present invention will be described in detail with reference to the attached drawings. In the drawings, the same reference numerals denote the same members.

Figure 3:
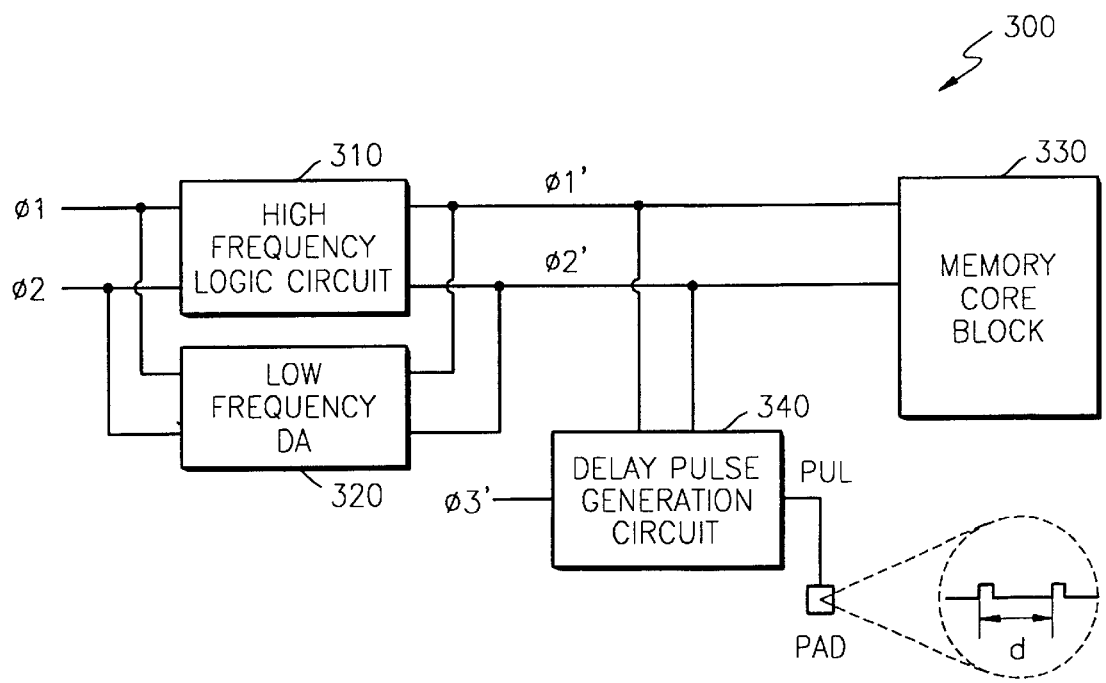
FIG. 3 is a diagram illustrating a semiconductor memory device according to an embodiment of the present invention.

Referring to FIG. 3, a semiconductor memory device 300 includes a high frequency logic circuit 310, a low frequency direct access unit (DA) 320, a memory core block 330 and a delay pulse generation circuit 340. The high frequency logic circuit 310 operates depending on external clock signals $\phi 1$ and $\phi 2$ during normal operation and controls the high speed operation of the memory device 300, to interface with memory core block 330. The high frequency logic circuit 310 may include high frequency logic circuits such as delay lock loops (DLL) and may receive and transmit an interface protocol, as would be understood by one of ordinary skill.

The low frequency DA 320 directly tests memory cells within the memory core block 330 during a direct access operation without operating the high frequency logic circuit 310, to detect defects of the memory cells. The low frequency DA 320 may be any direct access unit as would be well known, that operates to test memory cell (core) parameters at low frequencies of 100 MHz for example, although other frequencies may be used. Memory core block 330 operates at a high frequency of 400 MHz for example, although other frequencies may also be used. Accordingly, it is to be understood that the low frequency DA 320 operates the memory core block 330 at low speed. As well known to one of ordinary skill in the art, the direct access operation is a test for defects in the memory cells, that occur because of bridges or variation in parameters due to a change in fabrication processes. It should be apparent that high speed operation is thus not necessary during the test. The memory core block 330 reads data from or writes data to memory cells depending on internal clock signals $\phi 1'$ and $\phi 2'$ generated by the high frequency logic circuit 310 or the low frequency DA 320.

The delay pulse generation circuit 340 receives the internal clock signals $\phi 1'$ and $\phi 2'$ and generates a pulse signal PUL corresponding to the difference between the delay time of the first internal clock signal $\phi 1'$ and the delay time of the second internal clock signal $\phi 2'$. The pulse signal PUL is transmitted to a pad PAD, and the period of the pulse signal PUL can be externally measured using an oscilloscope. The period of the pulse signal PUL indicates the difference "d" between the delay time of the first internal clock signal $\phi 1'$ and the delay time of the second internal clock signal $\phi 2'$. The delay pulse generation circuit 340 is illustrated in detail in FIG. 4.

Figure 4:
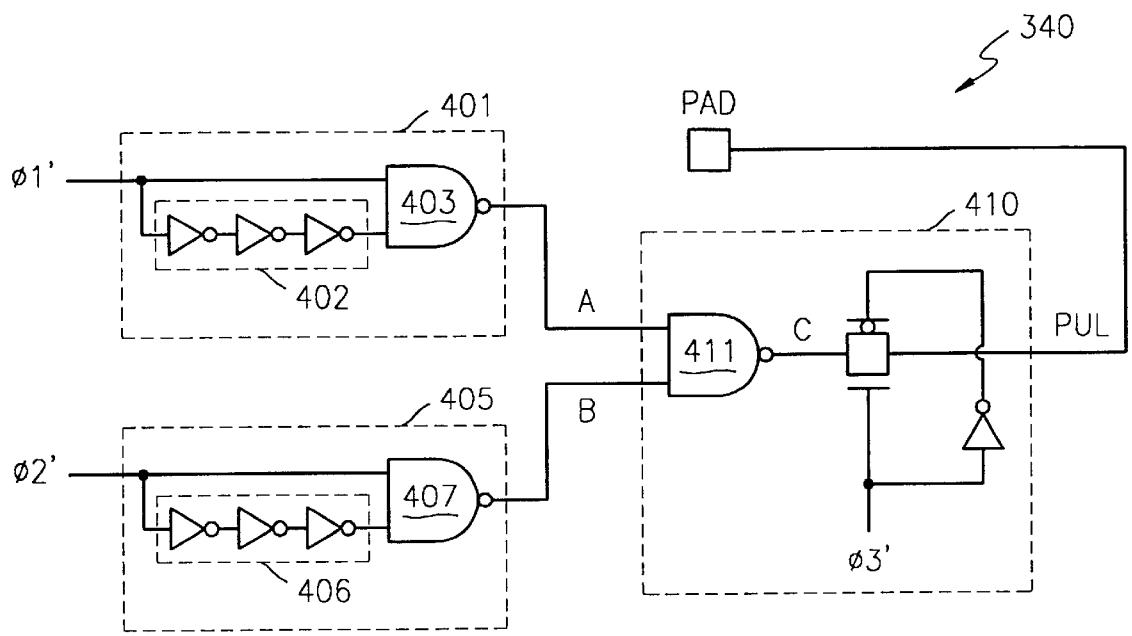
FIG. 4 is a diagram illustrating the delay pulse generation circuit of FIG. 3.

Referring to FIG. 4, the delay pulse generation circuit 340 includes a first internal pulse generator 401, a second internal pulse generator 405 and a pulse signal generator 410. The first internal pulse generator 401 includes a two-input NAND gate 403 that receives the first internal clock signal $\phi 1'$ and the output of a first delay unit 402 and that generates a first internal pulse signal A. The first delay unit 402 receives the first internal clock signal $\phi 1'$, and inverts and delays the first internal clock signal $\phi 1'$ a predetermined period of time. The second internal pulse generator 405 includes a two-input NAND gate 407 that receives the second internal clock signal $\phi 2'$ and the output of second delay unit 406 and that generates a second internal pulse signal B, in the same manner as in the first internal pulse generator 401. The second delay unit 406 receives the second internal clock signal $\phi 2'$, and inverts and delays the second internal clock signal $\phi 2'$ a predetermined period of time.

The pulse signal generator 410 receives the first internal pulse signal A and the second internal pulse signal B through a two-input NAND gate 411 and generates a third internal pulse signal C. A third internal clock signal $\phi 3'$ is generated from the MRS (Mode Register Set), and both directly and as provided through the illustrated inverter, controls the transmission gate at the output of NAND gate 411. The third internal pulse signal C thus is transmitted to the pad in response to the third internal clock signal $\phi 3'$ and appears as the pulse signal PUL.

Figure 5:
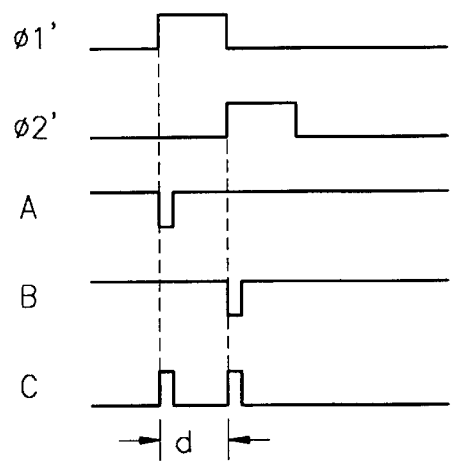
FIG. 5 is a timing diagram illustrating the operation of the delay pulse generation circuit of FIG. 4.

FIG. 5 is a timing diagram illustrating the operation of the delay pulse generation circuit 340 of FIG. 4. Referring to FIG. 5, the first and second internal clock signals φ1' and φ2' are generated with different delay times. The first internal pulse signal A is generated as a logic "low" level, and as having a pulse width corresponding to the delay time of the first delay unit 402 of FIG. 4, at the moment when the first internal clock signal φ1' is generated. The second internal pulse signal B is generated as a logic "low" level, and as having a pulse width corresponding to the delay time of the second delay unit 406 of FIG. 4, at the moment when the second internal clock signal φ2' is generated.

The third internal pulse signal C is generated as a logic "high" level corresponding to the pulse width of the logic "low" level of the first internal pulse signal A or the second internal pulse signal B. The third internal pulse signal C appears as consecutive two pulse signals. The time interval "d" between the two consecutive pulse signals corresponds to the difference between the time delay of the first internal clock signal φ1' and the time delay of the second internal clock signal φ2'. In this embodiment, the third internal pulse signal C appears as two consecutive pulse signals, but in an alternative embodiment, it may appear as a pulse signal having a pulse width corresponding to the interval from generation of the first internal clock signal φ1' and the generation of the second internal clock signal φ2'.

The third internal pulse signal C is transmitted to the pad in response to the third internal clock signal φ3'. It appears in the waveform shown at the pad of FIG. 3. This waveform is measured using an oscilloscope (not shown), and the measured value is input to a tester as a delay parameter when the memory core block 330 of FIG. 3 is tested. Therefore, the tester compensates for the actual delay of the internal clock signals so that the memory core block 330 is tested depending on delay compensated internal clock signals. In other words, the memory core block 330 operates depending on internal clock signals having the same conditions as those of internal clock signals generated by the high frequency logic circuit 310, even during a direct access operation, so that an error in the operation of the memory core block 330 can be prevented.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory device comprising:
    a memory core block including a plurality of memory cells;
    a logic circuit that generates a first internal clock signal and a second internal clock signal respectively in response to a first external clock signal and a second external clock signal, and that operates said memory core block at high speed during normal operation;
    a direct access circuit that generates a third internal clock signal and a fourth internal clock signal respectively in response to the first external clock signal and the second external clock signal, to test the plurality of memory cells within said memory core block during a direct access operation; and
    a delay pulse generation circuit that generates a pulse signal having a pulse period or interval equal to a delay difference between the third internal clock signal and the fourth internal clock signal generated by said direct access circuit.

2. The semiconductor memory device of claim 1, wherein said delay pulse generation circuit comprises:
    a first internal pulse generator that receives the third internal clock signal and generates a first internal pulse signal having a first pulse width;
    a second internal pulse generator that receives the fourth internal clock signal and generates a second internal pulse signal having a second pulse width; and
    a pulse signal generator that receives the first and second internal pulse signals and generates the pulse signal.

3. The semiconductor memory device of claim 2, wherein said first internal pulse generator comprises:
    a delay unit that delays the third internal clock signal a predetermined period of time; and
    a NAND gate that receives the third internal clock signal and an output of said delay unit, and that outputs the first internal pulse signal.

4. The semiconductor memory device of claim 2, wherein said second internal pulse generator comprises:
    a delay unit that delays the fourth internal clock signal a predetermined period of time; and
    a NAND gate that receives the fourth internal clock signal and an output of said delay unit, and that outputs the second internal pulse signal.

5. The semiconductor memory device of claim 2, wherein said pulse signal generator comprises:
    a NAND gate that receives the first and second internal pulse signals and generates a third internal pulse signal; and
    a transmission gate that outputs the third internal pulse signal as the pulse signal in response to a fifth internal clock signal.

6. The semiconductor memory device of claim 1, wherein said delay pulse generation circuit generates a first pulse signal corresponding to generation of the third internal clock signal and generates a second pulse signal corresponding to generation of the fourth internal clock signal.

7. The semiconductor memory device of claim 1, wherein said delay pulse generation circuit generates a pulse signal corresponding to an interval between generation of the third internal clock signal and generation of the fourth internal clock signal.

8. The semiconductor memory device of claim 1, wherein said logic circuit provides the first and second internal clock signals to said memory core block to operate said memory core block.

9. The semiconductor memory device of claim 1, wherein said direct access circuit provides the third and fourth internal clock signals to said memory core block to test the plurality of memory cells.

10. A method of operating a semiconductor memory device having a memory core block including a plurality of memory cells, comprising:
    generating a first internal clock signal and a second internal clock signal respectively responsive to a first external clock signal and a second external clock signal;
    operating the memory core block based on the first and second internal clock signals during a normal operation mode;
    generating a third internal clock signal and a fourth internal clock signal respectively responsive to the first external clock signal and the second external clock signal;
    testing the plurality of memory cells based on the third and fourth internal clock signals during a direct access operation mode; and generating a pulse signal having a pulse period or interval equal to a delay difference between the third and fourth internal clock signals.

11. The method of operating a semiconductor memory device of claim 10, wherein said generating pulse signal comprises:

generating a first internal pulse signal having a first pulse width based on the third internal clock signal;

generating a second internal pulse signal having a second pulse width based on the fourth internal clock signal; and generating the pulse signal based on the first and second internal pulse signals.

12. The method of operating a semiconductor memory device of claim 11, wherein said generating a first internal pulse signal comprises:

delaying the third internal clock signal a predetermined period of time; and performing a NAND logical operation on third internal clock signal and the delayed third internal clock signal, to provide the first internal pulse signal.

13. The method of operating a semiconductor memory device of claim 11, wherein said generating a second internal pulse signal comprises:

delaying the fourth internal clock signal a predetermined period of time; and performing a NAND logical operation on the fourth internal clock signal and the delayed fourth internal clock signal, to provide the second internal pulse signal.

14. The method of operating a semiconductor memory device of claim 11, wherein said generating the pulse signal comprises:

performing a NAND logical operation on the first and second internal pulse signals to provide a third internal pulse signal; and gating the third internal pulse signal with a fifth internal clock signal to provide the pulse signal.

15. The method of operating a semiconductor memory device of claim 10, wherein said generating a pulse signal comprises:

generating a first pulse signal corresponding to generation of the third internal clock signal; and generating a second pulse signal corresponding to generation of the fourth internal clock signal.

16. The method of operating a semiconductor memory device of claim 10, wherein said generating a pulse signal comprises generating a pulse signal corresponding to an interval between generation of the third internal clock signal and generation of the fourth internal clock signal.

17. The method of operating a semiconductor memory device of claim 10, wherein the first and second internal clock signals are provided to the memory core block during said operating the memory core block.

18. The method of operating a semiconductor memory device of claim 10, wherein the third and fourth internal clock signals are provided to the memory core block during said testing the plurality of memory cells.

* * * * *